United States Patent
Bruel et al.

(10) Patent No.: US 6,225,190 B1
(45) Date of Patent: May 1, 2001

(54) PROCESS FOR THE SEPARATION OF AT LEAST TWO ELEMENTS OF A STRUCTURE IN CONTACT WITH ONE ANOTHER BY ION IMPLANTATION

(75) Inventors: Michel Bruel, Veurey; Léa Di Cioccio, Saint Ismier, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 08/970,077

(22) Filed: Nov. 13, 1997

(30) Foreign Application Priority Data

Dec. 9, 1996 (FR) .................................................. 96 15089

(51) Int. Cl.[7] .............................. H01L 21/30; H01L 21/46
(52) U.S. Cl. .............................. 438/458; 438/53; 438/50; 438/407; 438/459
(58) Field of Search .............................. 438/53, 50, 407, 438/404, 458, 459

(56) References Cited

U.S. PATENT DOCUMENTS

| | | | | |
|---|---|---|---|---|
| 4,676,841 | * | 6/1987 | Celler | 438/766 |
| 5,250,460 | * | 10/1993 | Yamagata et al. | 438/458 |
| 5,346,841 | * | 9/1994 | Yajima | 438/295 |
| 5,374,564 | | 12/1994 | Bruel . | |
| 5,494,835 | * | 2/1996 | Bruel | 156/250 |
| 5,510,277 | * | 4/1996 | Cunningham et al. | 438/707 |
| 5,559,043 | | 9/1996 | Bruel . | |
| 5,714,395 | * | 2/1998 | Bruel | 438/528 |
| 5,863,830 | * | 1/1999 | Bruel et al. | 438/478 |
| 5,863,832 | * | 1/1999 | Doyle et al. | 438/622 |

FOREIGN PATENT DOCUMENTS 2 211 991  7/1989 (GB) .

OTHER PUBLICATIONS

M. Bruel, et al., Proceedings 1995 IEEE International SOI Conference, Oct. 3–5, 1995, "Smart Cut: A Promising New SOI Material Technology".

* cited by examiner

Primary Examiner—Carl Whitehead, Jr.
Assistant Examiner—Jamie L. Davis
(74) Attorney, Agent, or Firm—Oblon, Spivak, McClelland, Maier & Neustadt, P.C.

(57) ABSTRACT

A process for separating at least two elements of a structure. The two elements are in contact with one another along an interface and are fixed to one another by interatomic bonds at their interface. An ion implantation is performed in order to introduce ions into the structure with an adequate energy for them to reach the interface and with an adequate dose to break the interatomic bonds. This brings about at the interface, the formation of a gaseous phase having an adequate pressure to permit the separation of the two elements.

13 Claims, 4 Drawing Sheets

Figure 1:
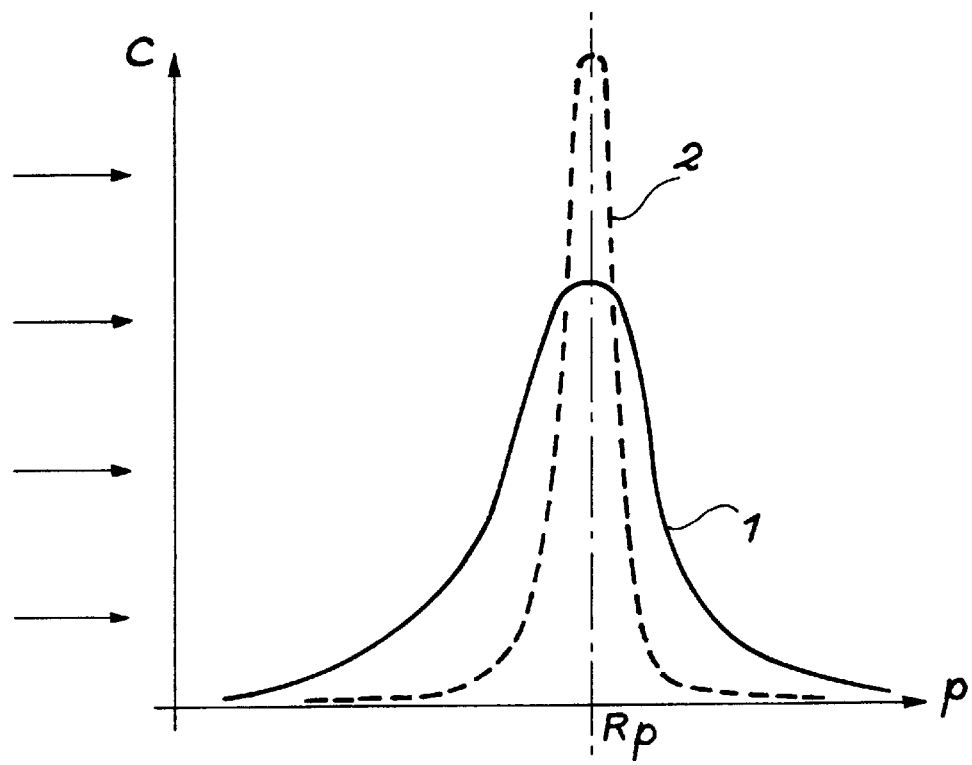

PROCESS FOR THE SEPARATION OF AT LEAST TWO ELEMENTS OF A STRUCTURE IN CONTACT WITH ONE ANOTHER BY ION IMPLANTATION

The present invention relates to a process for the separation of at least two elements of a structure, said two elements being in contact with one another along an interface and are fixed to one another by interatomic bonds at said interface. The two elements of the structure are made from solid materials, which can be of different types. They can be conductive, semiconductive or dielectric materials.

According to a first use of the invention, said process permits a complete separation of the two elements of the structure. According to a second use of the invention, said process permits a localized separation of the two elements in order to e.g. obtain micro-cushions pressurized by a gaseous phase.

The separation of the two elements bonded together by interatomic bonds is not easy to bring about, particularly in the case of elements having very small dimensions, such as occurs in the microelectronics field. This operation is even more difficult when it is desired to bring about a localized separation of two elements. Such a localized separation, when it is envisaged between two layers of a microelectronic structure, would make it possible to obtain micro-cushions pressurized by the introduction of a gas between the separated parts of the two layers.

The obtaining of such pressurized micro-cushions in microelectronic structures is particularly difficult to obtain using conventional processes. Thus, most microelectronics processes take place in atmospheric pressure or low pressure machines. Under such conditions, even if it is possible to introduce a gaseous phase at a given pressure into a micro-cavity produced in a structure by establishing a physical communication with a medium containing the corresponding gas at a desired pressure, it is difficult or even impossible to seal the micro-cavity maintaining the gaseous phase at the desired pressure.

The inventors of the present invention have discovered that it is possible to introduce a gaseous phase at the interface between two contacting layers without any need for a physical communication between said interface and the exterior. They have discovered that, by the implantation of ions of an appropriate gas, it is possible to break interatomic bonds existing between the atoms of the layers located on either side of the interface and even obtain, if the implanted ion dose is sufficiently high, the presence of a gaseous phase in the area of the interface which has been implanted. If the implanted ion dose is correctly adjusted, the gaseous phase introduced has an adequate pressure to bring about the detachment of the two layers and supply a pressurized micro-cushion. By treating the entire interface, it is possible to obtain a complete separation of the two layers.

The invention therefore has as its object a process for the separation of at least two elements of a structure, the two elements being in contact with one another along an interface and are fixed to one another by interatomic bonds at said interface, characterized in that it consists of carrying out an ion implantation in order to introduce ions into the structure with an adequate energy for them to reach said interface and with an adequate dose to break said interatomic bonds and permit a separation of the two elements.

The dose of implanted ions can be such that it brings about, at said interface, the formation of a gaseous phase having an adequate pressure to permit the separation of the two elements.

The process can be subdivided into the actual ion implantation stage, optionally followed by a heat treatment stage making it possible to concentrate the implanted ions at said interface.

For example, if the structure is a semiconductor structure of the silicon on insulator type, a silicon layer constituting one of the two elements of the structure and a silicon oxide layer constituting the other element of the structure, the implanted ions can be hydrogen ions.

Ion implantation can take place on the entire structure, so as to obtain a complete separation of the two elements of the structure.

It can also be performed on at least one area of said interface, so as to obtain a separation of the two elements of the structure in said area. In this case, ion implantation can take place at a dose making it possible to give the gaseous phase formed in said area an adequate pressure to deform at least one of the two elements of the structure. Preferably, the shape of said implanted area is such that the deformation of said element of the structure constitutes a pad or cushion. The outer face of the element deformed by the pressure of the gaseous phase can be rendered conductive (e.g. by depositing a metal coating), so that the structure can present a flexible electrical contact to an external element. The process can also involve the formation of electrodes positioned in such a way as to form at least one capacitor, where said gaseous phase serves as a dielectric.

According to the latter aspect of the invention, the process can be used for obtaining a pressure transducer by measuring the capacitance of the capacitor. It can also be used for obtaining an array of pressure transducers by measuring capacitances corresponding to the capacitors formed from such an array of implanted areas.

The process according to the present invention can also be used for obtaining a mass of SiC covered with a $SiO_2$ layer, said structure being constituted by a first silicon element and a second $SiO_2$ element obtained by thermal growth from the first element, the second element being joined to the SiC mass before bringing about the separation between the first and second elements.

The invention is described in greater detail hereinafter relative to on-limitative embodiments and the attached drawings, wherein show:

FIG. 1 A graph illustrating the concentration profile of ions implanted in a material.

Figure 2:
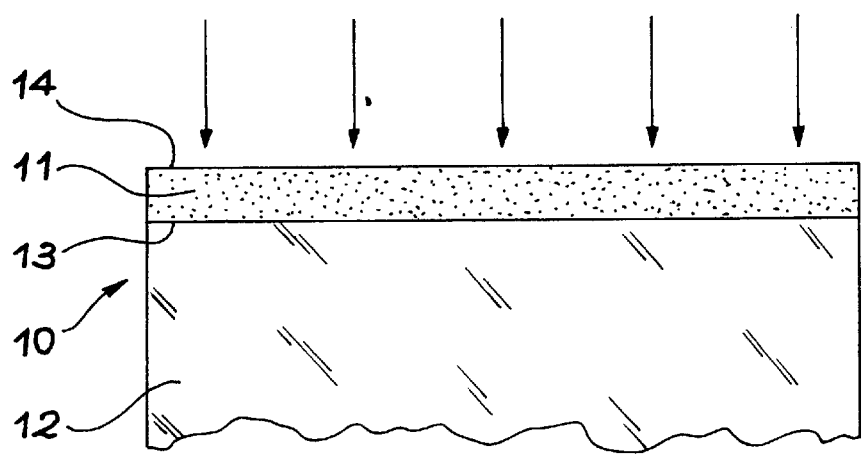

FIG. 2 The application of the process according to the invention in order to obtain the separation of two layers adhering to one another along an interface.

Figure 3:
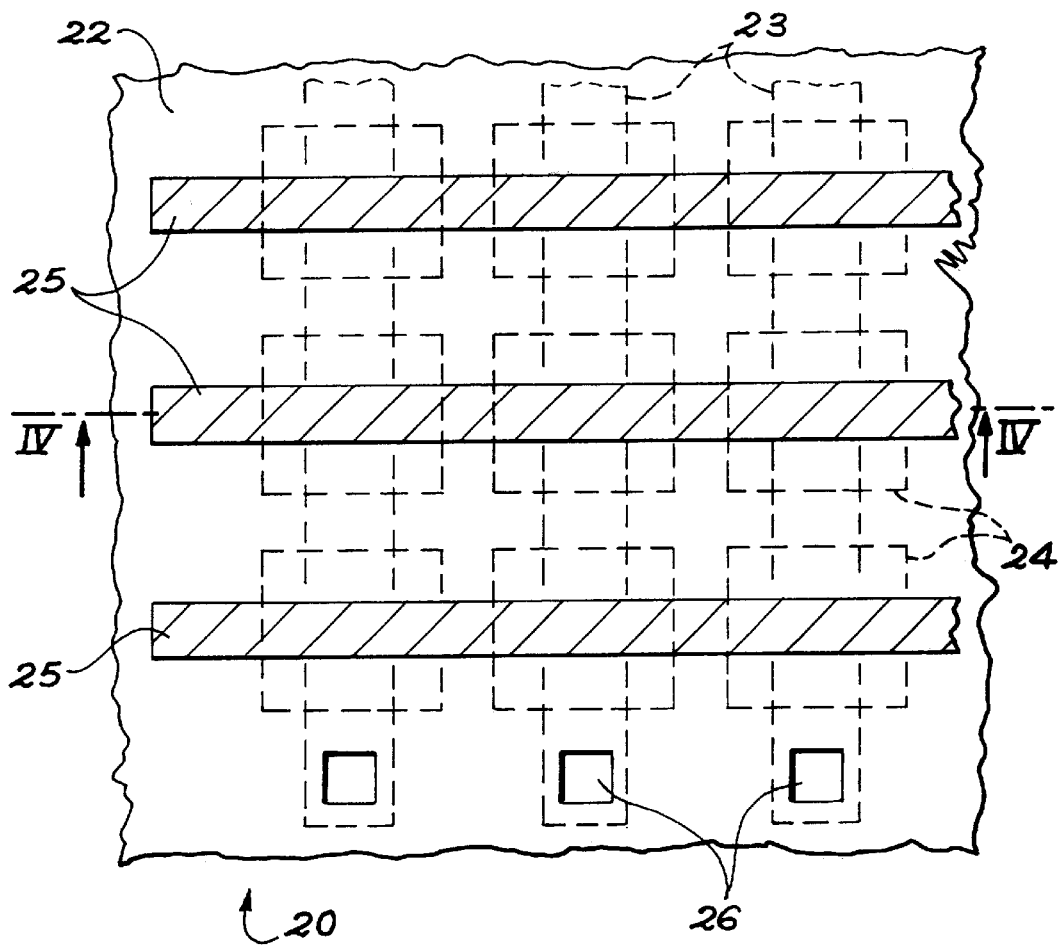

FIG. 3 A plan view of an array of pressure transducers obtained by applying the process according to the invention.

Figure 4:
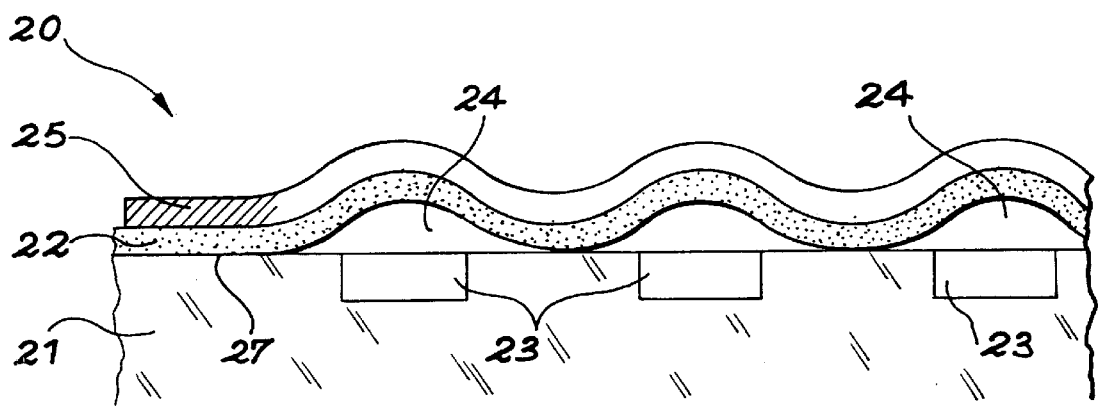

FIG. 4 A side and sectional view along axis IV—IV of the array of pressure transducers shown in FIG. 3.

Figure 5:
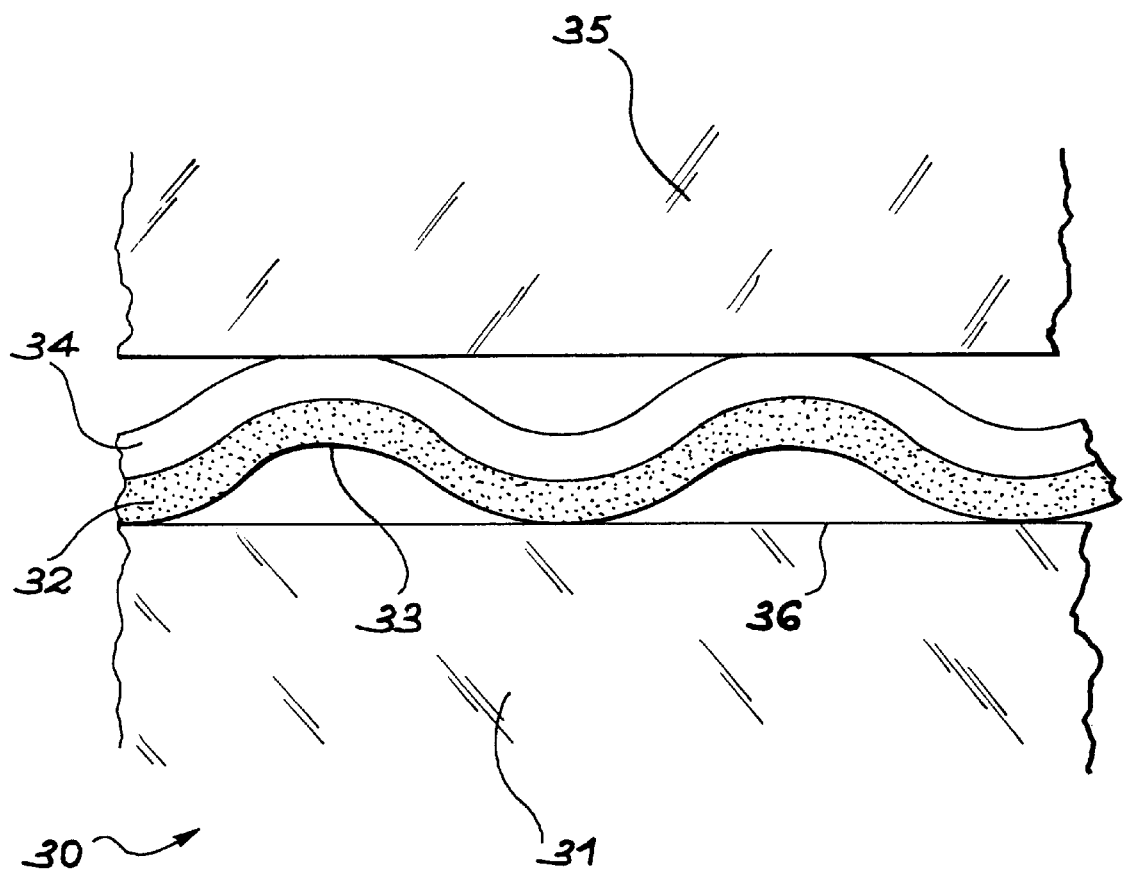

FIG. 5 A side and sectional view of a structure having a flexible electrical contact obtained by applying the process according to the invention.

Figure 6A:
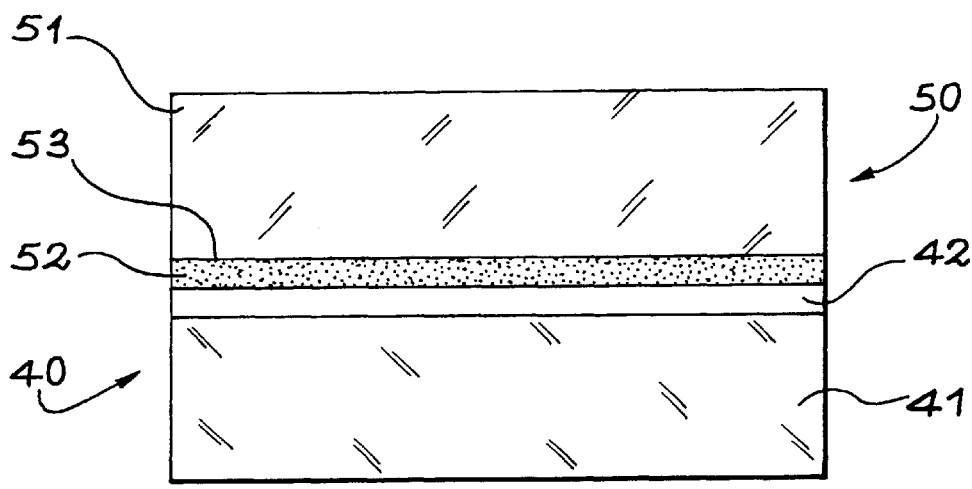
Figure 6B:
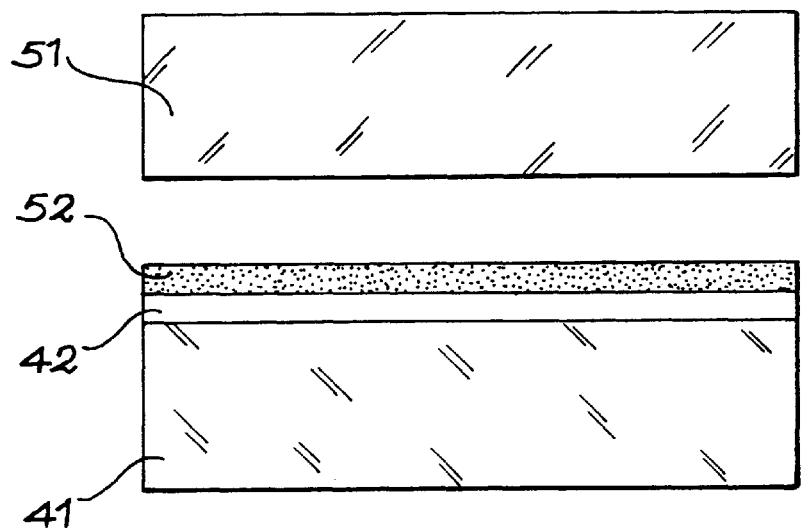

FIGS. 6A & 6B A particular application of the process according to the invention.

On bombarding a plate or wafer of a solid material with ions, the latter penetrate to a more or less deep extent into said plate or wafer, as a function of the energy given thereto and as a function of the nature of the material. If the wafer is made from a homogeneous material, has a planar face and ion bombardment takes place by an ion beam having a given energy, the ions implanted in the wafer will be distributed around a mean depth with a maximum concentration around said mean depth. FIG. 1 shows an example of an ion concentration profile corresponding to the implantation of H⁺ ions (protons) in a monocrystalline silicon wafer. For further details reference should be made to FR-A-2 681 472 describing a "Process for the production of thin semiconductor material films".

In FIG. 1, the ordinate axis corresponds to the planar face of the wafer by which penetrates an ion beam of given energy and symbolized by arrows. The abscissa axis, parallel to the ion beam direction, represents the depth p of the wafer. The curve 1 represents the concentration profile C of the implanted ions, implantation having taken place at a given temperature, e.g. ambient temperature. Curve 1 shows that the concentration of implanted ions is at a maximum for the depth Rp. It is consequently possible to concentrate a relatively large quantity of ions at a given depth within a solid element.

According to the present invention, use is made of said procedure for bringing about the separation of two elements connected to one another along an interface by interatomic bonds. The principle of the invention consists of introducing ions at the interface of two elements, said ions being able to break the interatomic bonds existing between the two elements. These ions are introduced at the interface in accordance with a given dose, which is adequate to bring about the separation of the two elements. This means that the separation can take place because there are sufficient broken interatomic bonds and because the implantation can also bring about, as a function of the dose, the formation of a gaseous phase at the interface having a pressure which can contribute to the separation of the two elements. This separation can take place naturally, i.e. without any force being exerted on the elements. The separation can also take place by exerting a force, e.g. a mechanical force on the elements.

For effectiveness reasons, it is advantageous for the maximum concentration of implanted ions to coincide with the interface between the two elements to be separated. For this purpose, it is merely necessary to calculate the implantation parameters as a function of the nature of the material or materials constituting the elements to be separated and as a function of the nature of the ions.

The effectiveness of the process can also be improved by carrying out an appropriate heat treatment, following the ion implantation stage. In certain cases, such a heat treatment permits the redistribution of the concentration profile of the implanted atoms in order to obtain a narrower concentration profile with a higher apex. It is then possible to obtain a profile corresponding to curve 2 for the example illustrated in FIG. 1.

FIG. 2 illustrates the application of the process to the complete separation of two elements 11 and 12 constituting a structure 10 and fixed to one another by interatomic bonds along their interface 13. For example, it will be assumed that element 11 is a $SiO_2$ layer with a thickness of 1 $\mu$m obtained by low pressure CVD on element 12, which is a monocrystalline silicon substrate. The ions implanted through the face 14 of layer 11 parallel to interface 13 are H⁺ ions. The implantation dose is $5 \cdot 10^{16}$ ions/cm² and the energy of the ions is between 100 and 140 keV. A heat treatment following the implantation stage can take place at 500° C. for 30 minutes. The implanted ions modify the interatomic bonds existing between the atoms of the elements on either side of the interface. In the present case of a Si—$SiO_2$ interface, the introduction of hydrogen makes it possible to break the Si—O—Si bonds by transforming them into Si—O—H and Si—H bonds.

Another application example concerns the separation of thin films in a silicon on insulator-type substrate. As a result of the process according to the-invention, it is possible to separate the silicon surface layer from the substrate, or the assembly constituted by the silicon surface layer and the buried insulator layer from the remainder of the substrate. It is merely necessary to implant hydrogen ions, either at the thin silicon film-insulator layer interface, if it is wished to recover the silicon layer, or at the insulator layer-solid silicon interface if it is wished to recover the assembly constituted by the silicon film and the insulator layer.

FIGS. 3 and 4 illustrate an application of the process for obtaining localized separations of the two elements. FIGS. 3 and 4 relate to the production of an array of pressure transducers 20. The starting structure comprises a n doped monocrystalline silicon substrate 21, on which has been grown a thermal oxide layer 22. Thus, the layer 22 and substrate 21 have an interface 27. The substrate 21 has recesses 23 in the form of p⁺ doped, parallel strips in order to render them conductive.

The obtaining of localized separations between the layer 22 and substrate 21 takes place in the following way. By lithographic masking, openings corresponding to the surface of the areas to be implanted are exposed. This is followed by an ion implantation of hydrogen at a given dose and given energy, so that in majority manner the said ions reach the interface between the layer 22 and substrate 21 through the openings of the mask deposited on the layer 22. The mask also prevents the ions from reaching the interface. The dose of implanted ions is also adequate to induce the formation of a gaseous phase in the interface areas in question. The mask is then removed. It is therefore possible to obtain an array of pressurized cushions 24 corresponding to an array of openings in the mask. Said cushions 24 are placed above the recesses 23. Optionally, said process can involve a heat treatment stage for concentrating the implanted ions at the interface.

Deposition then takes place on the oxide layer 22 of electrodes 25 constituted-by strips which are parallel to one another, but perpendicular to the strip-like recesses 23 and passing on the pressurized cushions. The deposition of contact blocks 26, after etching the oxide layer, ensures the electrical connection with the recesses 23. The electrodes 25 and contact blocks 26 can be of aluminium and can be deposited during the same stage.

As a variant, the deposition of electrodes 25 and contact blocks 26 can take place prior to the ion implantation operation. Ion implantation then takes place subsequently, with an adequate energy to traverse the electrodes 25 and oxide layer 22.

This gives an array of pressure transducers of the capacitive type. Each pressure transducer is constituted by the elementary capacitor located at the intersect ion of an electrode 25 and an electrode 23 (or conductive recess), between which the re is a pressurized cushion 24.

Thus, the array of pressure transducers comprises rows (e.g. metal electrodes 25) and columns (e.g. conductive recesses 23). The pressure in an element (i, j) of the transducer array, corresponding to the intersection of a row i and a column j is obtained by measuring the capacitance of the element (i, j). For this purpose, all the rows, except row i, and all the columns, except column j, are placed under high impedance. The capacitance between row i and column is then measured.

In a similar way, it is possible to have a structure with a flexible electrical contact to an external element. This is illustrated in FIG. 5, where the starting structure 30 is constituted by a monocrystalline silicon substrate 31 covered with a thermal oxide layer 32. Thus, the layer 32 and substrate 31 have an interface 36. By ion implantation, optionally followed by a heat treatment stage, it is possible to detach certain areas of the layer 32 from the substrate 31 in order to obtain pads 33 with the desired shape. The oxide layer 32 is covered with a metal layer 34. The structure 30 then ensures a flexible electrical contact with an external element 35.

Another application example relates to the transfer of a layer placed on an initial substrate to a target substrate. The process according to the invention is then of particular interest for obtaining a good quality, thermal oxide layer on a target substrate, particularly of SiC. Thus, direct thermal growth of oxide on a SiC substrate gives a poor quality oxide. According to the invention, a good quality oxide layer can be produced on an initial silicon substrate and transferred to a SiC target substrate. The process can be performed in the following way.

The target substrate is e.g. constituted by a SiC wafer covered with an epitaxied SiC layer in order to obtain a satisfactory quality silicon carbide. The initial substrate is constituted by a silicon wafer on which has been grown a thermal oxide layer. According to the invention, ions, e.g. hydrogen ions, are implanted at the interface between the oxide layer and the silicon mass of the initial substrate. The dose of implanted ions is chosen so as not to obtain an immediate separation of the oxide layer, but in such a way that said separation can subsequently take place by means of an appropriate heat treatment.

The two substrates are contacted, the thermal oxide layer being adjacent to the epitaxied SiC layer, after the surfaces which are to be contacted have received an appropriate preparation (cleaning, polishing). This surface preparation permits a bonding of the two layers by molecular adhesion. This gives the assembly shown in FIG. 6A, where the target substrate 40 is constituted by a SiC wafer 41 covered with an epitaxied layer 42 and where the initial substrate 50 is constituted by a silicon wafer 51 covered by a thermal oxide layer 52. The reference 53 represents the interface between the wafer 51 and layer 52, said interface having undergone ion implantation.

The assembly can then undergo an optional heat treatment at a relatively low temperature $T_1$ for reinforcing the interatomic bonds between the layers 42 and 52, so as to increase their adhesion.

This is followed by the separation into two parts of the thus formed assembly, at the interface 53 and in accordance with the present invention. This separation is e.g. obtained by a heat treatment performed at a temperature $T_2>T_1$. The result obtained is shown in FIG. 6B.

Complimentary operations can then be carried out, namely a surface finishing operation of the free face of the oxide layer 52 (e.g. by polishing or etching) and a stabilization operation of the bonding of the layers 42 and 52 by a heat treatment at a temperature $T_3>T_2$.

Although the examples described hereinbefore relate to a structure, whose main constituent elements are of silicon and silicon oxide, the process according to the invention can apply to any solid material, provided that the thickness of the elements permits an appropriate implantation of the ions at a considered interface.

What is claimed is:

1. A process for the separation of at least two elements of a structure from each other, said two elements being in contact with one another along an interface and being fixed to one another by interatomic bonds at said interface, comprising the step of:

performing an ion implantation in order to introduce ions into the structure with an adequate energy for them to reach said interface and with an adequate dose to break said interatomic bonds so as to separate the two elements of the structure at said interface into two solid parts.

2. The separation process according to claim 1, wherein the implanted ion dose brings about, at said interface, the formation of a gaseous phase having an adequate pressure to permit the separation of the two elements.

3. The separation process according to claim 1, comprising the actual ion implantation stage, followed by a heat treatment stage permitting the concentration of the implanted ions at said interface.

4. The separation process according to claim 1, wherein, said structure being a semiconductor structure of the silicon on an insulator type, a silicon layer constituting one of the two elements of the structure, and a silicon oxide layer constituting the other element of the structure, the implanted ions are hydrogen ions.

5. The process according to claim 1, wherein ion implantation takes place on the entire interface, so as to obtain a complete separation of the two elements of the structure.

6. A process for the separation of at least two elements of a structure from each other, the two elements being in contact with one another along an interface and are fixed to one another by interatomic bonds at said interface, consisting of performing an ion implantation in order to introduce ions into the structure with an adequate energy for them to reach said interface and with an adequate dose to break said interatomic bonds and permit a separation of the two elements, wherein ion implantation takes place on at least one area of said interface, so as to obtain a separation of the two elements of the structure in said area.

7. The process according to claim 6, wherein ion implantation takes place at a dose bringing about, at said interface, the formation of a gaseous phase, the implanted ion dose making it possible to give the gaseous phase formed in said area an adequate pressure to deform at least one of the two elements of the structure.

8. A process for the separation of at least two elements of a structure from each other, said two elements being in contact with one another along an interface and being fixed to one another by interatomic bonds at said interface, comprising the step of:

performing an ion implantation in order to introduce ions into the structure with an adequate energy for them to reach said interface and with an adequate dose to break said interatomic bonds so as to separate the two elements of the structure at said interface;

wherein the ion implantation takes place on at least one area of said interface, so as to obtain the separation of the two elements of the structure in said area;

wherein said ion implantation takes place at an implanted ion dose bringing about, at said interface, formation of a gaseous phase, said implanted ion dose making it possible to give the gaseous phase formed in said area an adequate pressure to deform at least one of the two elements of the structure; and wherein the shape of said implanted area for deformation of said element of the structure constitutes one of a pad and a cushion.

9. A process for the separation of at least two elements of a structure from each other, said two elements being in contact with one another along an interface and being fixed to one another by interatomic bonds at said interface, comprising the step of:

performing an ion implantation in order to introduce ions into the structure with an adequate energy for them to reach said interface and with an adequate dose to break said interatomic bonds so as to separate the two elements of the structure at said interface;

wherein the ion implantation takes place on at least one area of said interface, so as to obtain the separation of the two elements of the structure in said area;

wherein said ion implantation takes place at an implanted ion dose bringing about, at said interface, formation of a gaseous phase, said implanted ion dose making it possible to give the gaseous phase formed in said area an adequate pressure to deform at least one of the two elements of the structure; and wherein an external face of the element deformed by the pressure of the gaseous phase is made conductive, so that the structure can have a flexible electrical contact with an external element.

10. A process for the separation of at least two elements of a structure from each other, said two elements being in contact with one another along an interface and being fixed to one another by interatomic bonds at said interface, comprising the step of:

performing an ion implantation in order to introduce ions into the structure with an adequate energy for them to reach said interface and with an adequate dose to break said interatomic bonds so as to separate the two elements of the structure at said interface;

wherein the ion implantation takes place on at least one area of said interface, so as to obtain the separation of the two elements of the structure in said area;

wherein said ion implantation takes place at an implanted ion dose bringing about, at said interface, formation of a gaseous phase, said implanted ion dose making it possible to give the gaseous phase formed in said area an adequate pressure to deform at least one of the two elements of the structure; and wherein there is a formation of electrodes positioned so as to form at least one capacitor, wherein said gaseous phase acts as a dielectric.

11. The process according to claim 10, wherein the formation of electrodes allows the capacitance of said capacitor to be measured, thus obtaining a pressure transducer.

12. The process according to claim 10, wherein the formation of electrodes allows the capacitances corresponding to the capacitors formed from an array of implanted areas to be measured, thus obtaining an array of pressure transducers.

13. A process for the separation of at least two elements of a structure, said two elements being in contact with one another along an interface and being fixed to one another by interatomic bonds at said interface, comprising the step of:

performing an ion implantation in order to introduce ions into the structure with an adequate energy for them to reach said interface and with an adequate dose to break said interatomic bonds and permit a separation of the two elements into two solid parts;

wherein ion implantation takes place on the entire interface, so as to obtain a complete separation of the two elements of the structure into the two solid parts; and wherein said structure includes a first silicon element and a second $SiO_2$ element obtained by thermal growth from the first element;

said process further comprising the step of bonding the second element to a SiC mass before separating the first and second elements into the two solid parts.

* * * * *